United States Patent
Pinkerton et al.

(10) Patent No.: US 6,465,039 B1
(45) Date of Patent: Oct. 15, 2002

(54) METHOD OF FORMING A MAGNETOSTRICTIVE COMPOSITE COATING

(75) Inventors: Frederick Eugene Pinkerton, Shelby Township, Macomb County, MI (US); Thomas Hubert Van Steenkiste, Ray, MI (US); Jerome Joseph Moleski, Clinton Township, Macomb County, MI (US); Martin Stephen Meyer, Southfield, MI (US)

(73) Assignees: General Motors Corporation, Detroit, MI (US); Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/928,008

(22) Filed: Aug. 13, 2001

(51) Int. Cl.[7] .................................................. B05D 5/12
(52) U.S. Cl. ...................... 427/132; 427/128; 427/201; 427/427
(58) Field of Search ................................ 427/128, 132, 427/201, 427

(56) References Cited

U.S. PATENT DOCUMENTS

| | | |
|---|---|---|
| 5,302,414 A | 4/1994 | Alkhimov et al. |
| 5,585,574 A | 12/1996 | Sugihara et al. |
| 5,741,982 A | 4/1998 | Kobayashi et al. |
| 5,907,105 A | 5/1999 | Pinkerton et al. |
| 5,985,049 A | 11/1999 | Pinkerton et al. |
| 5,993,565 A | 11/1999 | Pinkerton et al. |
| 6,139,913 A | 10/2000 | Van Steenkiste et al. |

*Primary Examiner*—Bernard Pianalto
(74) *Attorney, Agent, or Firm*—Kathryn A. Marra

(57) ABSTRACT

A low porosity, strong, composite magnetostrictive coating is formed on a substrate by low temperature, high velocity spraying of a particulate mixture of a magnetostrictive $REFe_2$ composition and a strong metallic matrix material. The practice is particularly useful for forming circumferential bands of composite magnetostrictive material on a round shaft such as an automobile steering column. An example of a composite material is the magnetostrictive $SmFe_2$ compound and iron or copper as the strengthening matrix material.

10 Claims, 8 Drawing Sheets

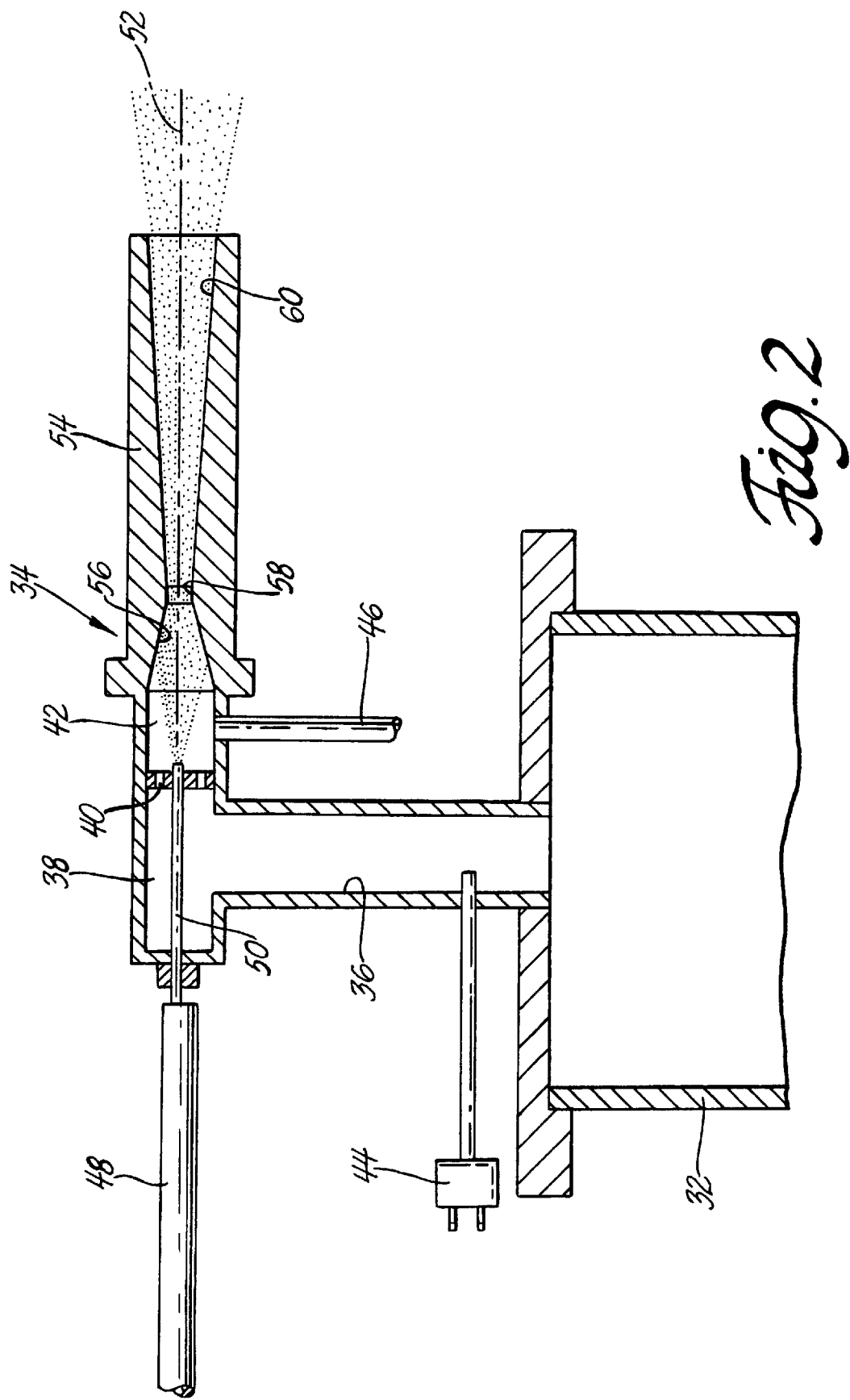

METHOD OF FORMING A MAGNETOSTRICTIVE COMPOSITE COATING

TECHNICAL FIELD

This invention pertains to a method of preparing a magnetostrictive coating on a substrate where the coating is a composite of discrete magnetostrictive RE-Fe$_2$ particles in a strengthening metal matrix. More specifically this invention pertains to a high velocity, high kinetic energy spray process for applying a particulate mixture of magnetostrictive compound and matrix metal on a substrate as a strong, low porosity magnetostrictive composite. The subject method is particularly useful for forming such coatings on round shafts, such as automotive steering columns, to serve in a torque sensing system.

BACKGROUND OF THE INVENTION

Magnetostriction occurs when a material develops significant strain on exposure to a magnetic field. At room temperature sample dimensions can change by as much as fractions of a percent. Conversely, the straining of a magnetostrictive material changes its magnetization state.

Magnetostrictive materials have been used with electromagnetic actuators to form transducers which serve as, for example, ultrasonic generators or fine control valves for metering of fluids. In these applications, variation of an imposed magnetic field produces proportional strains in the magnetostrictive material to produce a mechanical output. Conversely, a magnetostrictive material can be used as a torque sensor in the form of a magnetostrictive ring mounted on a shaft such as an automobile steering shaft. Torque in such a shaft would strain the magnetostrictive ring, giving rise to a detectable change in the ring's magnetization.

Maximizing device performance naturally suggests using materials having large saturation magnetostriction, $\lambda_s$, which is a dimensionless measure of the field-induced strain, frequently expressed in parts per million (ppm). High values of $\lambda_s$ are found in rare earth-iron compounds such as the terbium-iron compound, TbFe$_2$, where $\lambda_s$ equals 1750 ppm for a polycrystalline sample. Unfortunately, the rare earth-iron compounds are very brittle materials having little tensile strength, an unfavorable property for automotive applications requiring good mechanical properties. On the other hand, stronger and tougher materials such as steels have very limited magnetostriction. T250 maraging steel, which is currently being evaluated in torque sensors, has a $\lambda_s$ of only –30 ppm.

Furthermore, it is not easy to attach a T250 maraging steel ring (or other rings of magnetostrictive material) to a steering shaft in sufficiently intimate contact to make a suitably sensitive automotive torque sensor. Hardened rings of magnetostrictive T250 maraging steel are machined from bar or tube stock and attached to hardened nitronic steel shaft by one of two procedures. A tapered ring is press fitted onto a shaft having a matching taper, or a ring is brazed onto a hollow shaft followed by ballizing (pressing an oversized ball bearing down the inside of the shaft).

Strong, durable and machinable composite compositions displaying high magnetostrictive strains have been described in U.S. Pat. Nos. 5,985,049 and 5,993,565 to Pinkerton, Herbst, Capehart, Murphy and Brewer, both patents entitled "Magnetostrictive Composites" and assigned to the assignee of this invention. These composites include magnetostrictive materials of the rare earth-iron compound type, RE-Fe$_2$, where RE is one or more of the rare earth elements including yttrium, preferably samarium or terbium. While these rare earth-iron compounds display significant magnetostriction they cannot withstand machining or even normal handling without breaking. The patents teach compositions and methods by which particles of the rare earth-iron compounds are mixed with particles of a strong, suitably malleable metal such as aluminum, copper, iron, magnesium or nickel and the mixture suitably hot pressed to make a strong and useful magnetostrictive body. In the above patented practices, the hot pressing is controlled so as to form a nearly fully densified composite body without degrading the magnetostriction of the rare earth-iron compound particles.

Thus, the compositions and methods of the '049 and '565 patents enable the manufacture of strong machinable composite bodies for applications in which magnetostriction is a required or desired property. One such application for magnetostrictive materials is in torque sensors, for example, in electronically controlled, automotive power steering systems. Such sensors are described in U.S. Pat. No. 5,907,105 to Pinkerton, Herbst, Capehart, Perry and Meyer, entitled "Magnetostrictive Torque Sensor utilizing RE-Fe$_2$—Based Composite Materials" and assigned to the assignee of this invention. In that application, circumferentially magnetized, hot pressed ReFe$_2$—matrix metal composite bodies in the form of rings are used in or on steering column shafts as part of a sensing system to detect the driver applied torque to the shaft.

Like the application of magnetostrictive T250 steel materials, the hot pressing and machining of a composite ring and the fitting of the ring onto the shaft, or inserting the ring as part of a steel or aluminum shaft, also presents manufacturing complexity. These manufacturing issues raise the question as to whether REFe$_2$ magnetostrictive material could be applied in a simpler method to a substrate such as a steering column so as to retain the useful responses to torque changes of the above described hot pressed composite bodies.

SUMMARY OF THE INVENTION

This invention provides a method of forming a magnetostrictive composite coating of discrete rare earth-iron compound particles and metal matrix material on a desired substrate. In accordance with a preferred embodiment of the invention, the coating is applied to a suitable steel or aluminum automobile steering shaft to serve as a portion of a torque sensor device for determining angular position of the shaft in an electronically controlled power steering system.

A mixture of magnetostrictive ReFe$_2$ powder and metal matrix material powder is sprayed onto a suitable substrate by a relatively low temperature supersonic velocity spray process sometimes called kinetic spraying. Kinetic spray processes are described in U.S. Pat. No. 6,139,913 and 5,302,414. The mixture is transported from a powder reservoir in a relatively low volume, high pressure stream of unheated gas and introduced into a larger volume, high pressure stream of heated carrier spray gas. The combined stream of gas and suspended powder undergoes adiabatic expansion through a suitable converging-diverging nozzle, such as a de Laval nozzle. During passage through the converging-diverging nozzle the stream achieves a very high velocity, a supersonic velocity, with particles accelerating due to drag effects with the high velocity gas. The carrier spray gas is heated to increase its velocity in the diverging portion of the nozzle. These high kinetic energy particles are directed against a desired substrate such as a steering column. The spray nozzle is moved in a suitable pattern over or around the substrate to accumulate a coating pattern of desired thickness. The substrate is not normally preheated but it may experience some temperature increase from the high energy impact of the sprayed particles.

As the high velocity particles impact the substrate they form a well adhered composite coating. The softer matrix metal particles deform to envelop individual $REFe_2$ particles. The character and chemical identity of the rare earth-iron compound particles are unchanged but they are enclosed in a mechanically formed matrix of the metal composition to provide magnetostrictive properties to the low porosity coating. The proportions of $REFe_2$ particles and matrix metal particles may be widely varied depending upon the desired balance of magnetostriction and mechanical properties sought in the composite coating. Usually it will be preferred to maintain the proportions of the two types of particles within the range of twenty to eighty percent of $REFe_2$ particles and the balance the metal particles.

Thus, for example, a circumferential annular band of the composite material can be formed on a steering shaft and then magnetized circumferentially for use in a magnetostrictive torque sensor as illustrated, e.g., in FIGS. 1A and 1B of the above identified '105 patent.

The rare earth-iron compounds may contain any of the rare earth elements or yttrium as described in the above referenced patents. It is generally preferred to use samarium or mixtures of samarium and dysprosium, or mixtures of terbium and dysprosium because of their availability and the high magnetostriction that they provide in their compounds with iron. The matrix metal can also be any of the metals (or their suitably ductile alloys) used or described in the referenced patents. For example aluminum, copper, iron, molybdenum, stainless steel and tantalum powders have been used as matrix metals and brass and various steels have been used as substrates in the practice of this invention. Since the rare earth compounds are readily oxidized, the powder carrier gas and the spray gas may be non-oxidizing gases such as, e.g., nitrogen or helium. The main carrier gas is heated to increase the velocity of the gas stream as it flows through the spray nozzle. A temperature is chosen for this purpose, usually less than about 1200° F., at which the particles are not softened nor the composition or crystalline form of the $REFe_2$ compound altered.

It is apparent that the mixture being sprayed contains particles of different physical characteristics that may affect their tendency to adhere to a substrate. Moreover, the relative shapes of the spray pattern and the substrate can affect the yield of sprayed particles that adhere to the substrate. Depending upon actual experience with a specific $REFe_2$/metal particle mixture and substrate shape it may be necessary to adjust the proportions of the constituents to achieve a specified magnetostrictive composite composition.

The kinetic spray process used in the practice of this invention provides a relatively simple way to form low porosity, magnetostrictive composite coatings on a substrate that does not require hot pressing to consolidate the composite. Furthermore, it has been discovered that, in many instances, initially magnetically soft magnetostrictive particles become magnetically hard after their high velocity impact on the substrate. Magnetic coercivities of greater than 1000 Oersteds have been observed in the composite coatings.

Other objects and advantages of the invention will become apparent from a description of preferred embodiments.

BRIEF DESCRIPTION OF THE DRAWINGS

FIG. 2 is an enlarged cross sectional view of a converging-diverging spray nozzle for use in the process of this invention.

DESCRIPTION OF THE PREFERRED EMBODIMENT

The practice of this invention uses giant magnetostrictive compounds such as $SmFe_2$, $TbFe_2$, or like pseudobinary compounds $(Sm,R)Fe_2$ and $(Tb,R)Fe_2$ (where R is another rare earth or Y) in a matrix metal. Such composites combine the high magnetostriction of the $SmFe_2$ or $TbFe_2$ phase with the improved mechanical strength of the matrix. In this invention, composite magnetostrictive materials are created directly by a kinetic spray process. Powder of the desired magnetostrictive material is mixed in the desired proportion with powder of the metal matrix. The mixed powder is then kinetically sprayed onto a substrate. By using multiple passes of the kinetic spray gun, coatings of several mm in thickness can be built up.

Figure 1:
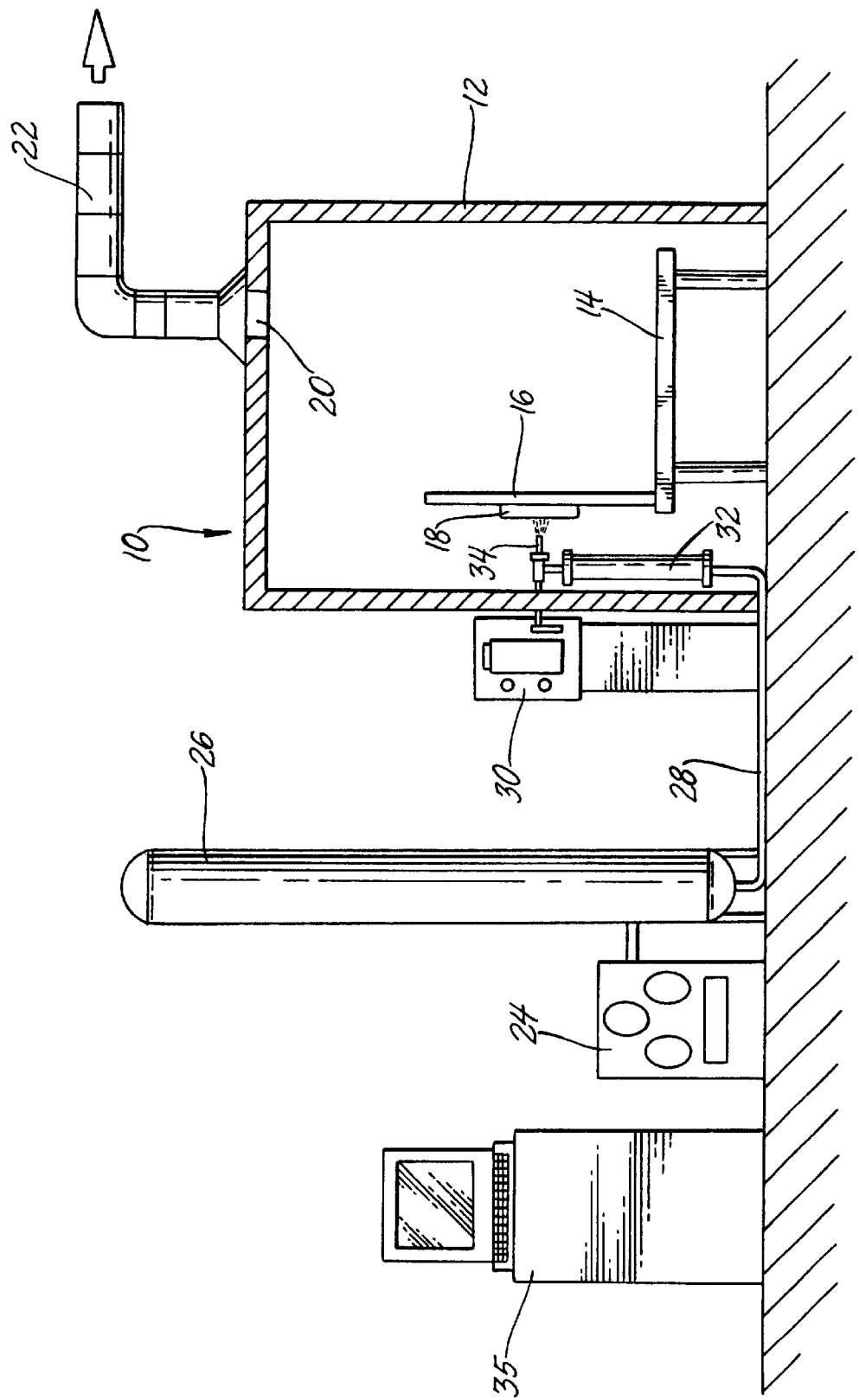
FIG. 1 is a schematic view of apparatus for conducting a preferred spray process in the practice of this invention.

The process used in the practice of this invention is described in U.S. Pat. No. 6,139,913, Kinetic Spray Coating Method and Apparatus, Van Steenkiste, et al, and earlier patent references cited in that patent. FIGS. 1 and 2 of this specification are like the corresponding figures of the "913 patent for the purpose of illustrating the kinetic spray process. However, the practice of this invention does not necessarily require the use of the large particles facilitated by the Van Steenkiste, et al process.

Referring to FIG. 1 of the drawings, numeral 10 generally indicates a kinetic spray system. System 10 includes an enclosure 12 in which a support table 14 or other support means is located. A mounting panel 16 fixed to the table 14 supports a work holder 18 capable of movement in three dimensions, plus rotation, and able to support a suitable workpiece formed of a substrate material to be coated. The enclosure 12 includes surrounding walls having at least one air or nitrogen inlet, not shown, and a gas outlet 20 connected by a suitable exhaust conduit 22 to a dust collector, not shown. During coating operations, the dust collector continually draws air from the enclosure and collects any dust or particles contained in the exhaust air for subsequent recovery and reuse or disposal.

The spray system further includes a gas compressor 24 capable of supplying a suitable gas at a pressure up to 3.4 MPa (500 psi) to a gas ballast tank 26. The gas tank 26 is connected through a line 28 to both a high pressure powder feeder 30 and a separate main spray gas heater 32. The gas heater 32 supplies the high pressure, heated main carrier gas, such as air, nitrogen or helium, to a kinetic spray nozzle 34. The temperature of the carrier gas affects its velocity as it exits the spray nozzle. Depending upon a spray application, it may be preferred to heat the carrier gas to higher temperatures to achieve higher energy powder impact, especially on hard substrates.

The powder feeder mixes particles of rare earth-iron compound particles and matrix metal particles with unheated high pressure gas and supplies the gas/powder mixture to a supplemental inlet of the kinetic spray nozzle 34. A computer control 35 operates to control the different pressures of the two gas streams and the temperature of the main stream spray gas supplied to the spray nozzle 34.

FIG. 2 of the drawings schematically illustrates the kinetic spray nozzle 34 and its connection to the gas heater 32 via a main gas passage 36. Passage 36 connects with a premix chamber 38 that directs gas through a flow straightener 40 into a mixing chamber 42. Temperature and pressure of the nitrogen or other gas main spray gas are monitored by a gas inlet temperature thermocouple 44 connected with the main gas passage 36 and a pressure sensor 46 connected with the mixing chamber 42.

The mixture of unheated high pressure powder transporter gas and coating powder is fed through a supplemental inlet line 48 to a powder feeder injection tube 50 which comprises a straight pipe having a predetermined inner diameter.

The pipe 50 has an axis 52 which is preferably also the axis of the premix chamber 38. The injection tube extends from an outer end of the premix chamber along its axis and through the flow straightener 40 into the mixing chamber 42. In accordance with the teaching of the '913 patent, it is preferred that the ratio of the gas flow area of the main gas passage 38 to the flow area of the powder pipe 50 be at least 80/1 when powder particles of 50 $\mu$m diameter or greater are being sprayed. The apparatus used in the spray experiments described in this specification had a powder pipe 50 diameter of 0.89 mm and a main gas passage diameter of 10 mm. Thus, the area ratio was 126/1.

Mixing chamber 42, in turn, communicates with a de Laval type converging-diverging nozzle 54. Nozzle 54 includes an entrance cone 56 with a diameter that decreases from 7.5 mm to a throat 58 of about 2mm diameter. In this specific example, the diverging portion of the nozzle has a rectangular cross section having dimensions of 2 mm by 10 mm at the exit end 60.

The spraying operation involves directing the spray nozzle toward a substrate so that a suitable proportion of the sprayed particles strike the substrate and adhere to it. The outlet of the spray nozzle may be shaped to produce a spray pattern that complements the shape of the substrate. The nozzle, the substrate or both may be moved during the spray operation to obtain the composite coating. The proportions of magnetostrictive rare earth-iron compound and metal matrix particles in the spray mixture may be adjusted, if necessary, to achieve a specified composition in the composite coating.

The practice of this spray process provides four features: (1) a coating of mixed $REFe_2$-matrix metal powder is successfully deposited by such spraying process, (2) the resulting mechanically deposited coating is a low porosity composite, (3) the composite coating is magnetostrictive, and (4) the coating on a suitable shaft can sense applied torque.

(1) Kinetic Sprayed Coatings of $REFe_2$/metal

The process was first practiced on flat sheets of brass and low carbon (1018) steel. Thirty to forty experiments were conducted to assess the utility of the process with composite magnetostrictive coatings. The $REFe_2$ compound was either $SmFe_2$ or "Terfenol" $Tb_{0.27}Dy_{0.73}Fe_2$, initially in a volume ratio of 30% $REFe_2$/70% matrix metal but mostly at a 50/50 mixture by volume.

As described in the prior art patents describing kinetic spray, here is considerable latitude in the size of particles that can be sprayed. In his application, for example, matrix metals have been sprayed in particle size ranges of 63 to 90 $\mu$m. Terfenol particles have been used in particle sizes up to 300 $\mu$m. $SmFe_2$ particles have been used in sizes up to 45 $\mu$m for sheet substrates and in particle sizes between 63 and 106 $\mu$m for shafts.

The powder mixtures were prepared and placed in the powder spray reservoir. The powder feed gas used to transport the powder mixture from the reservoir was nitrogen. The nitrogen was unheated. Powder was introduced into the feed gas stream using a feed screw and the "feed rate" of the powder into the carrier gas stream was varied by changing the rotation rate of the screw. The nitrogen borne powder was carried to the spray gun for mixing with the larger volume of main spray gas before the mixed stream entered the spray nozzle. The pressure varied depending on whether the main gas was air or helium. For air, the feed gas pressure was 350 psi and the main gas pressure was 300 psi. Air was used only for some of the flat substrate sprays. For helium, the feed gas pressure was 250 psi and the main gas pressure was 200 psi. As stated above, the ratio of the flow area of the main gas passage to the flow area of the powder tube was 126/1. The gun nozzle was rectangular producing a sheet of spray.

Various matrix metal powders have been used including aluminum, copper, iron, molybdenum and stainless steel. Air and helium were used as main spray gasses. The main spray gas pressure was maintained at a value less than the feed gas pressure. Tests were conducted with unheated powder feed gas and with main spray gas that had been preheated to 200°, 400°, 500°, 600°, 800°, 950°, 1000°, and 1100° F. respectively in separate coating tests. The outlet of the spray gun was maintained at 0.75 in from the substrate during all tests and the gun was moved over the surface of the substrate at a speed of about 0.1 in/s. One or more passes of the gun over a region of the substrate was employed depending upon the final coating thickness desired. All of the sprays onto flat stock resulted in a good, adherent coating.

A similar series of experiments was conducted to deposit the composite material onto brass and nitronic steel shafts for testing as a torque sensor. Again the rare earth- iron compounds were $SmFe_2$ and Terfenol. The matrix metals tested were aluminum, copper, iron and tantalum in particle sizes specified above. Unheated nitrogen gas at a pressure of 250 psig was used as the powder feed gas and helium at 200 psig was used as the main spray gas. The temperature of the main spray gas was varied over 300°, 400°, 500°, 600°, 700°, 800° and 1000° C., respectively in separate coating tests.

A series of coatings were sprayed onto the outer surface of 1 inch diameter shafts. Coating thicknesses ranged from 0 (no adhesion) to 2.24 mm. An additional series of tests were conducted using 1 inch diameter shafts with a recessed 1 mm deep×30 mm long area into which the composite was sprayed. The coating formed a 1 mm thick ring on the shaft with its outer surface approximately even with the surface of the shaft. In some cases an oversized coating was subsequently machined down to the nitronic shaft outer diameter. Coating quality on the shafts was more variable than with the sheets. Sometimes coatings appeared integral, but had one or more longitudinal bulges or ripples suggesting an underlying partial delamination from the underlying nitronic steel shaft.

The spray gun was located at a distance of 0.75 in from the rotating shaft. The shaft was mounted on a rotating fixture and rotated at 200, 300, 350 and 450 rpm for different coating tests in the testing sequence and the spray gun was moved along the axis of the shaft at speeds 0.002, 0.1, 0.125, 0.0.25 and 0.5 in/s. Coatings deposited using a few passes at a lower traverse speed of the gun seemed to give greater success than using a large number of passes at high traverse speed.

Figure 3A:
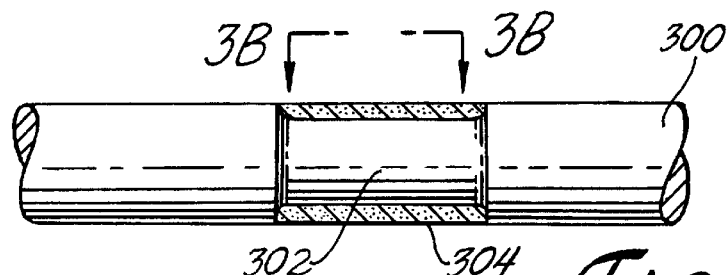
FIG. 3A is a view of a round shaft with a kinetic spray magnetostrictive composite coating, shown in cross-section, in accordance with the invention.

FIG. 3A is a drawing of shaft with its integral coating deposited by kinetic spraying. Shaft 300 is formed, for example, of nitronic steel and as a diameter of about 25 mm. The shaft was machined over about 30 mm of its length to reduce its radius by one mm to provide recess 302 to receive the spray coating 304. The composite coating after surface machining to the diameter of the adjacent shaft is shown in section at 304.

Figure 3B:
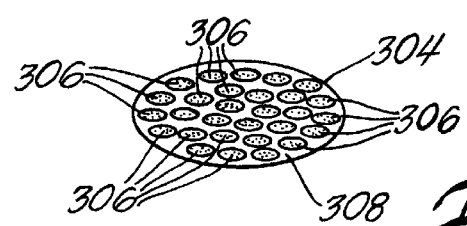
FIG. 3B is an enlarged view of the coating shown in FIG. 3A.

FIG. 3B is an enlarged and idealized view of coating 304 showing particles of magnetostrictive compound, REFe$_2$, 306 in a metal matrix 308.

(2) Composite Nature of the Coating

The nature of representative spray coatings was examined by x-ray diffraction, electron microprobe and energy dispersive x-ray spectroscopy. For example, an x-ray diffraction pattern was prepared of a SmFe$_2$/Cu coating deposited on a flat brass plate. The diffraction pattern showed peaks associated with the SmFe$_2$ phase and the Cu matrix, with no other diffraction peaks visible. The coating clearly consisted of the SmFe$_2$ compound and copper.

An electron microprobe image was prepared of a polished surface from the same spray sample. The coating was seen to consist of intact particles of SmFe$_2$ in a matrix of Cu. There was little porosity, as observed from the scarcity of pores in image of the composite.

An energy dispersive x-ray spectroscopy image was prepared of a representative area from a Terfenol/Al coating. This technique, by resolving the x-ray energy into energies characteristic of particular elements, can be used to map the location of specific elements on the microscopic level. A scanning electron microscope image gave an overall view of the coating showing the Terfenol particles in an aluminum matrix. Three additional images were resolved to show Al, Dy, and Fe. The images confirm than the coating consists of Terfenol particles (high concentrations of Dy, Fe and Tb) in an Al matrix.

(3) Magnetostriction and Magnetic Properties

Figure 4A:
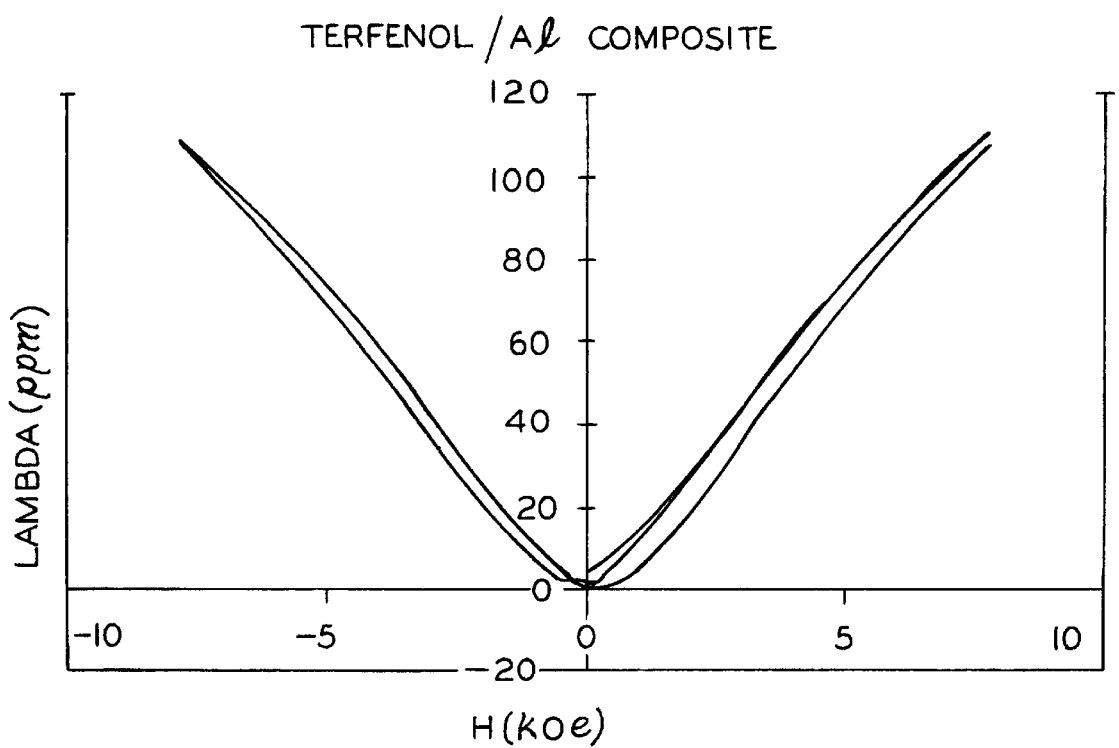
FIGS. 4A, 4B, 4C and 4D are graphs of magnetostriction, $\lambda=\frac{2}{3}(\lambda_\|-\lambda_\perp)$, in parts per million, ppm, as a function of applied magnetic field H(kOe) for initial starting powder compositions of 50%–50% by volume composites of Terfenol with aluminum in FIG. 4A, with copper in FIG. 4B, with iron in FIG. 4C and with molybdenum in FIG. 4D.

FIGS. 4A, 4B, 4C and 4D are graphs of magnetostriction, $\lambda$, in ppm vs. applied magnetic field, H, in kiloOersteds for coatings where the initial powder mixture consisted of equal parts by volume of Terfenol and matrix metal sprayed onto flat brass stock using various matrix metals. In FIG. 4A the matrix metal powder was Al, in (B) Cu, in (C) Fe and in (D) Mo. The quantity "Lambda" is $\lambda = \frac{2}{3}(\lambda_\| - \lambda_\perp)$, the difference in strains parallel and perpendicular to the applied field. These curves demonstrate that significant magnetostrictive strain develops in the sprayed composite coatings with an applied magnetic field.

Figure 4B:
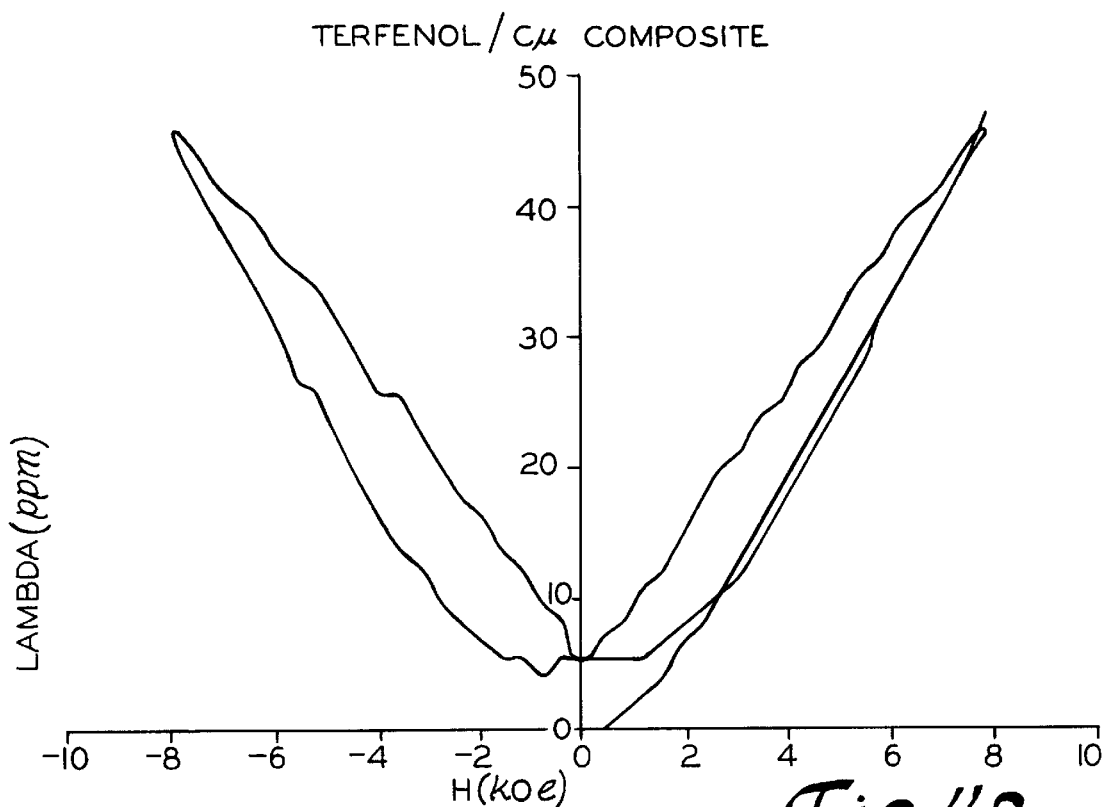
Figure 4C:
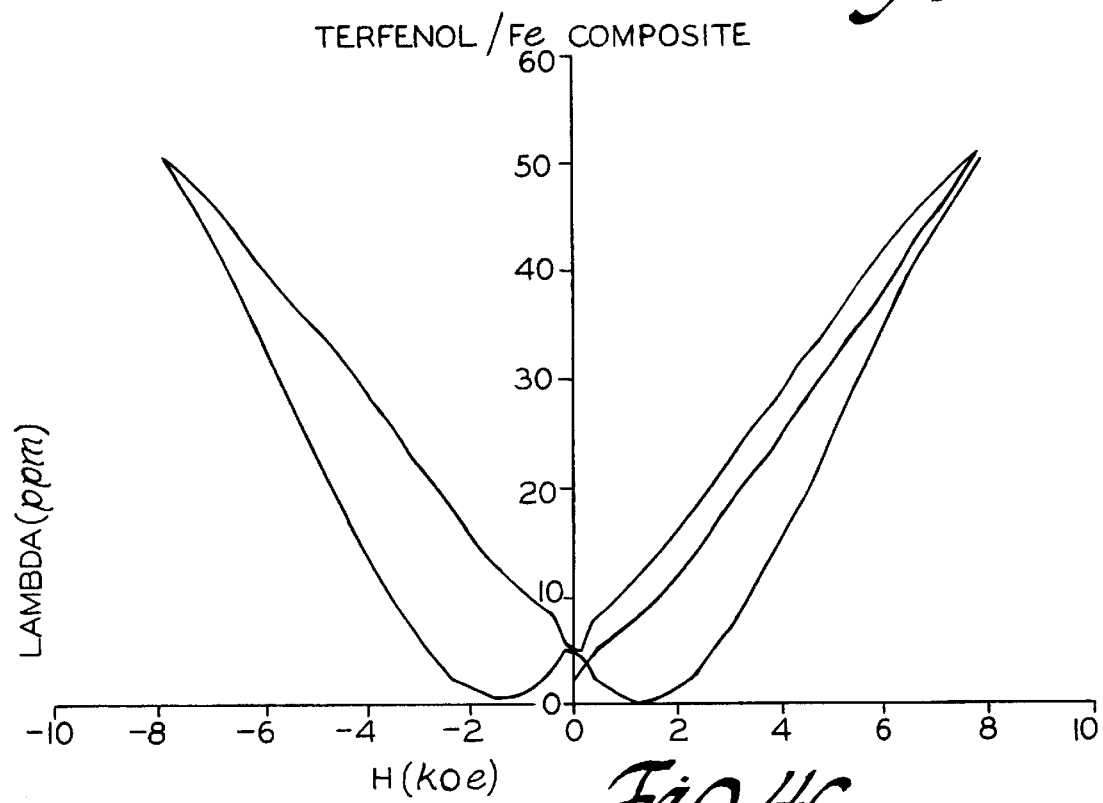
Figure 4D:
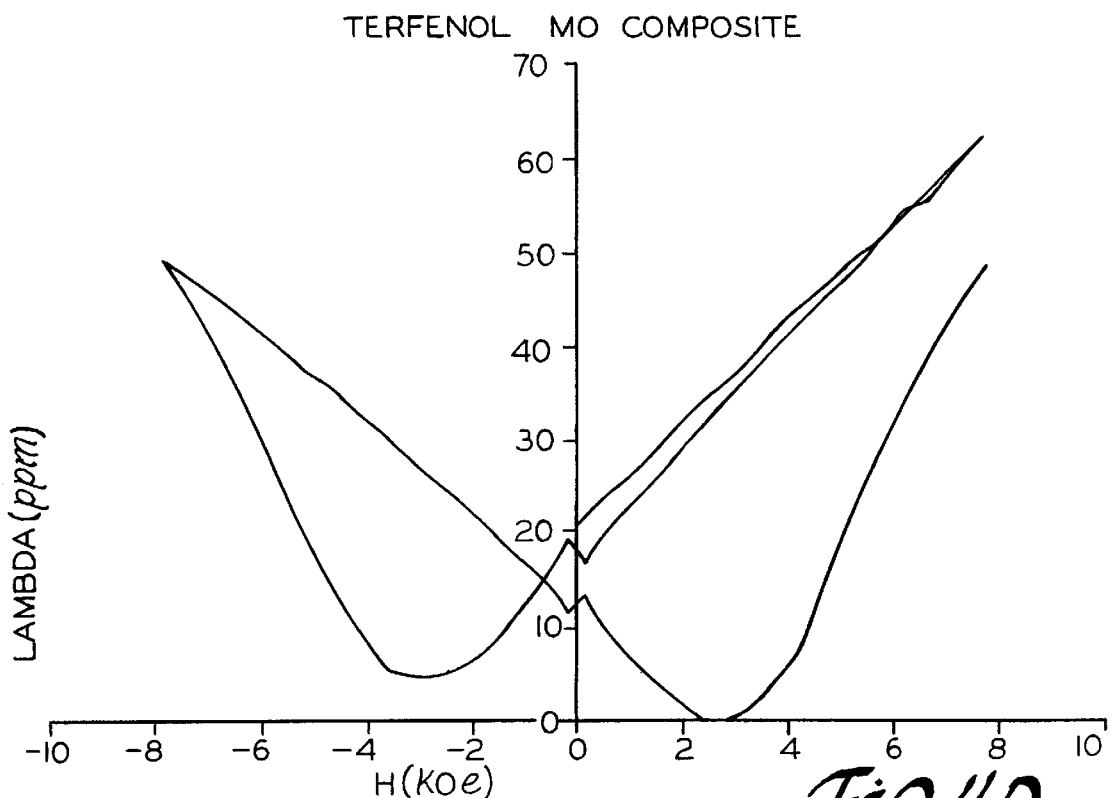

Note from FIGS. 4A and 4B that the magnetostriction values for Al and Cu matrix composites are symmetric around H=0, but that those with Fe and Mo matrix have split, or "butterfly" shaped loops. Such shapes are characteristic of composites in which the RFe$_2$ component has significant magnetic coercivity. Similar shapes are seen in composites prepared from rapidly quenched (melt-spun) RFe$_2$ ribbons having intrinsic coercivity Hci>0.7 kOe. Indeed, Terfenol/Mo composites are noticeably magnetic; pieces of the composite stick to each other magnetically.

Figure 5:
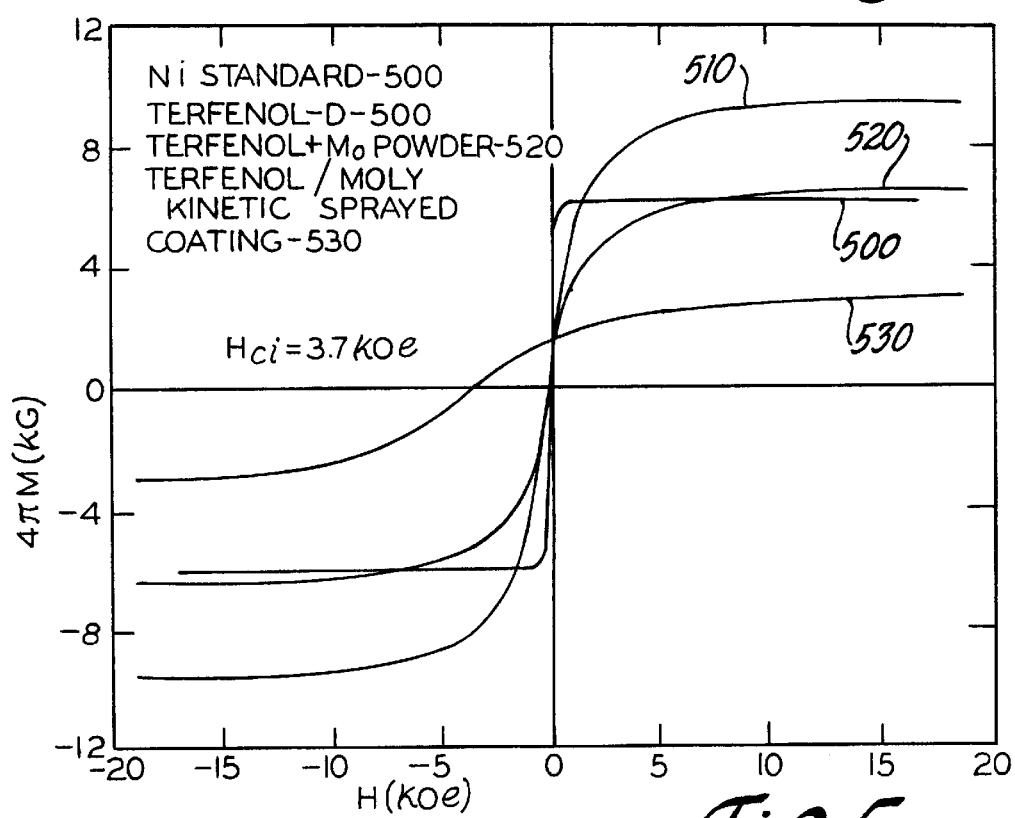
FIG. 5 is a graph of magnetization $4\pi M$ in kiloGauss vs. the radial component of the magnetic field, H, in kiloOersteds for a nickel standard, Terfenol D, Terfenol +molybdenum powder and a Terfenol/Mo coating sprayed in accordance with this invention.

To confirm the magnetically hard nature of the composite, the magnetic properties of a Terfenol/Mo composite were measured using a vibrating sample magnetometer. The results are shown in FIG. 5. Curve 500 is a nickel standard used for calibration. Curve 510 shows the magnetic behavior of the Terfenol powder used in the composite; it is magnetically soft with Hci<0.1 kOe. Curve 520 corresponds to the mixed Terfenol/Mo input powder for the spray process, confirming that the starting material is magnetically soft. Curve 530 is the magnetic behavior of the kinetically sprayed composite, which is magnetically hard with Hci=3.7 kOe. Thus, surprisingly the kinetic spray process with mechanically hard metal matrix particles has produced a magnetically hard coating from magnetically soft components. This is a useful aspect of the invention. For example, coercivity in a magnetostrictive element of a torque sensor on a steering shaft helps to maintain the desired circumferential field in the element.

(4) Torque Sensor Configuration

Tests of coated shafts in a torque sensor configuration are shown in FIGS. 6–9. The coating was first circumferentially magnetized by external permanent magnets or by passing a large current pulse through a copper rod inserted along the axis of the shaft. A known torque was applied to the shaft and a secondary Hall sensor located 0.3 mm from the coating measured changes in the radial magnetic field generated by the coating in response to the torque.

Figure 6:
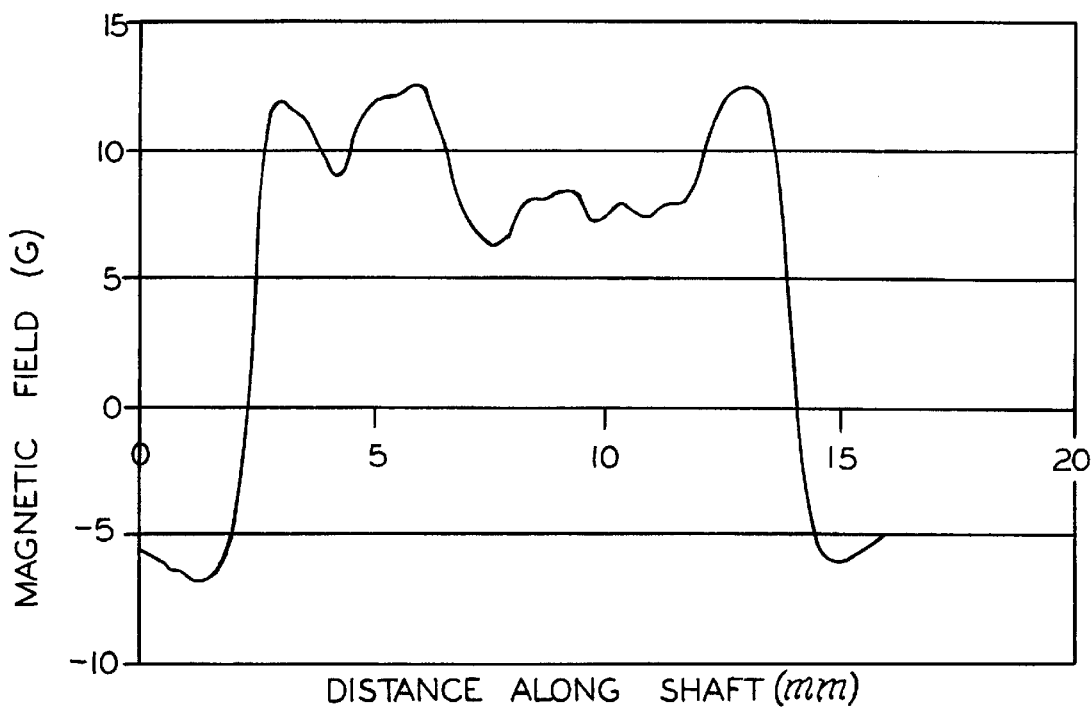
FIG. 6 is a graph of radial magnetic field in Gauss vs. distance along a composite $SmFe_2$/Cu coating on a Nitronic steel shaft.
Figure 7:
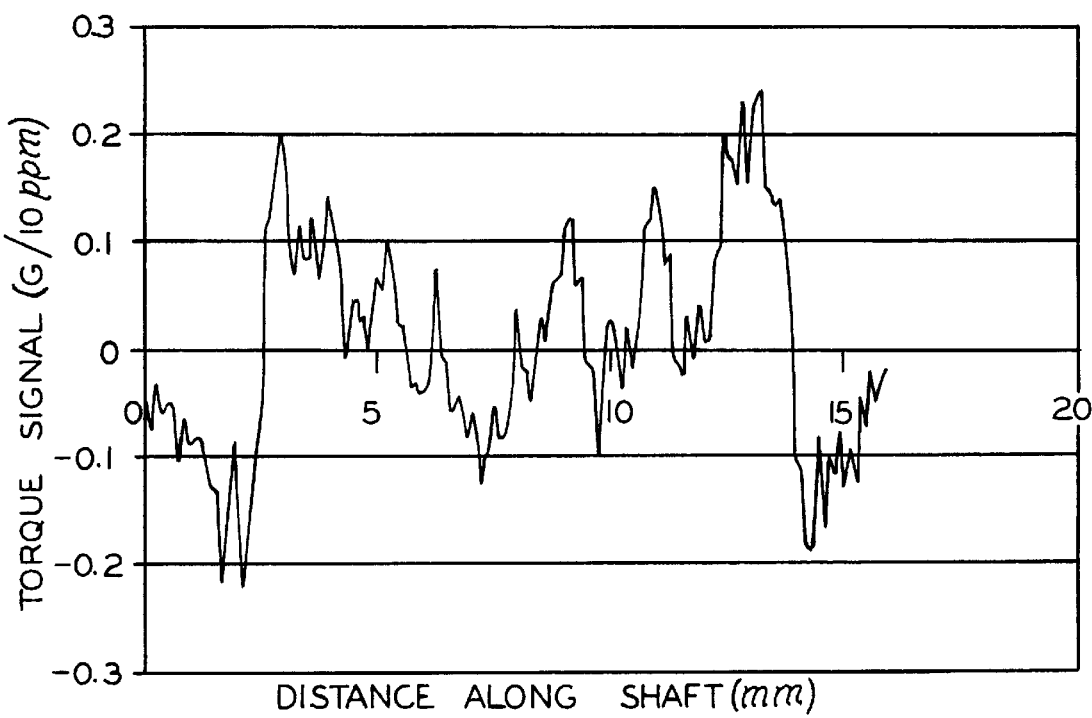
FIG. 7 is a graph of torque signal (Gauss/10 ppm strain) for the composite coating of FIG. 6.
Figure 8:
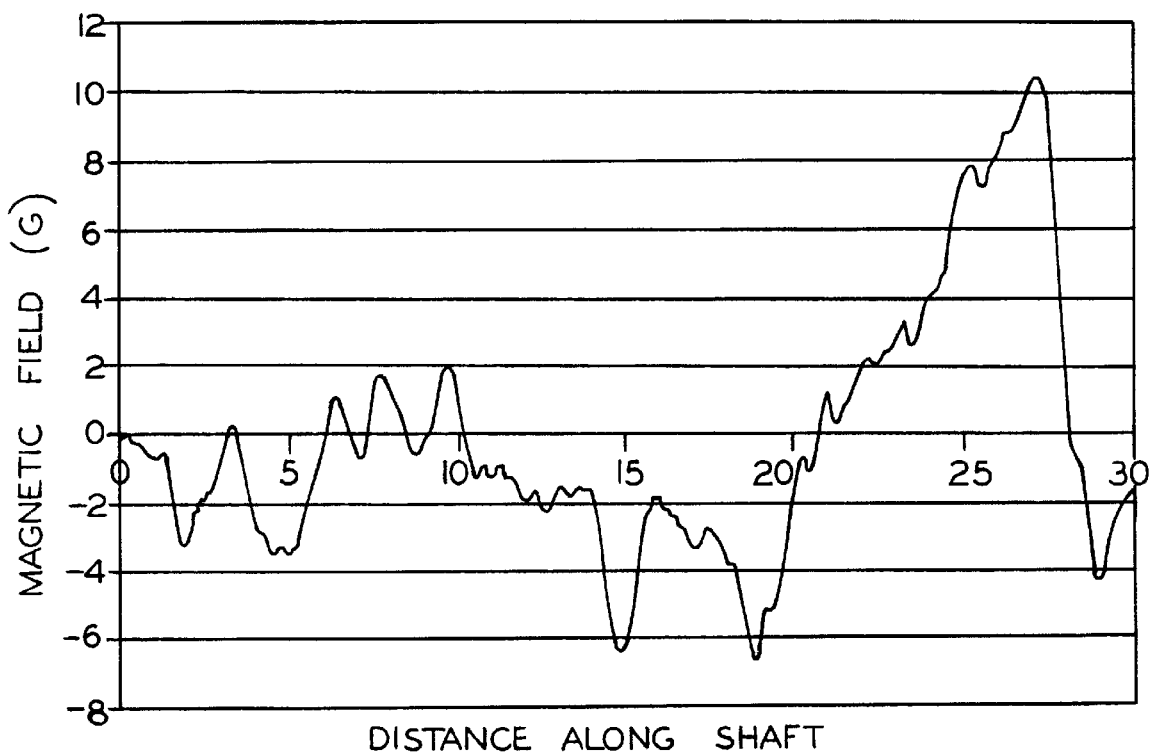
FIG. 8 is a graph like FIG. 6 for a Terfenol/copper coating on a Nitronic steel shaft.

A strain gauge on the surface of the coating monitored the strain induced in the coating by the applied torque. FIGS. 6 and 7 are for a SmFe$_2$/Cu coating on a Nitronic shaft. The Hall sensor was scanned along the coating in the axial direction three times, first with no applied torque and then with torque values giving induced surface strains of 10 ppm and 20 ppm. FIG. 6 shows the background magnetic field present at zero applied torque as a function of the position of the Hall sensor along the coating. FIG. 7 shows the change in the magnetic field generated for every 10 ppm of strain induced in the coating; this curve is the average of the field difference at 10 ppm strain and one-half of the field difference at 20 ppm of strain.

Figure 9:
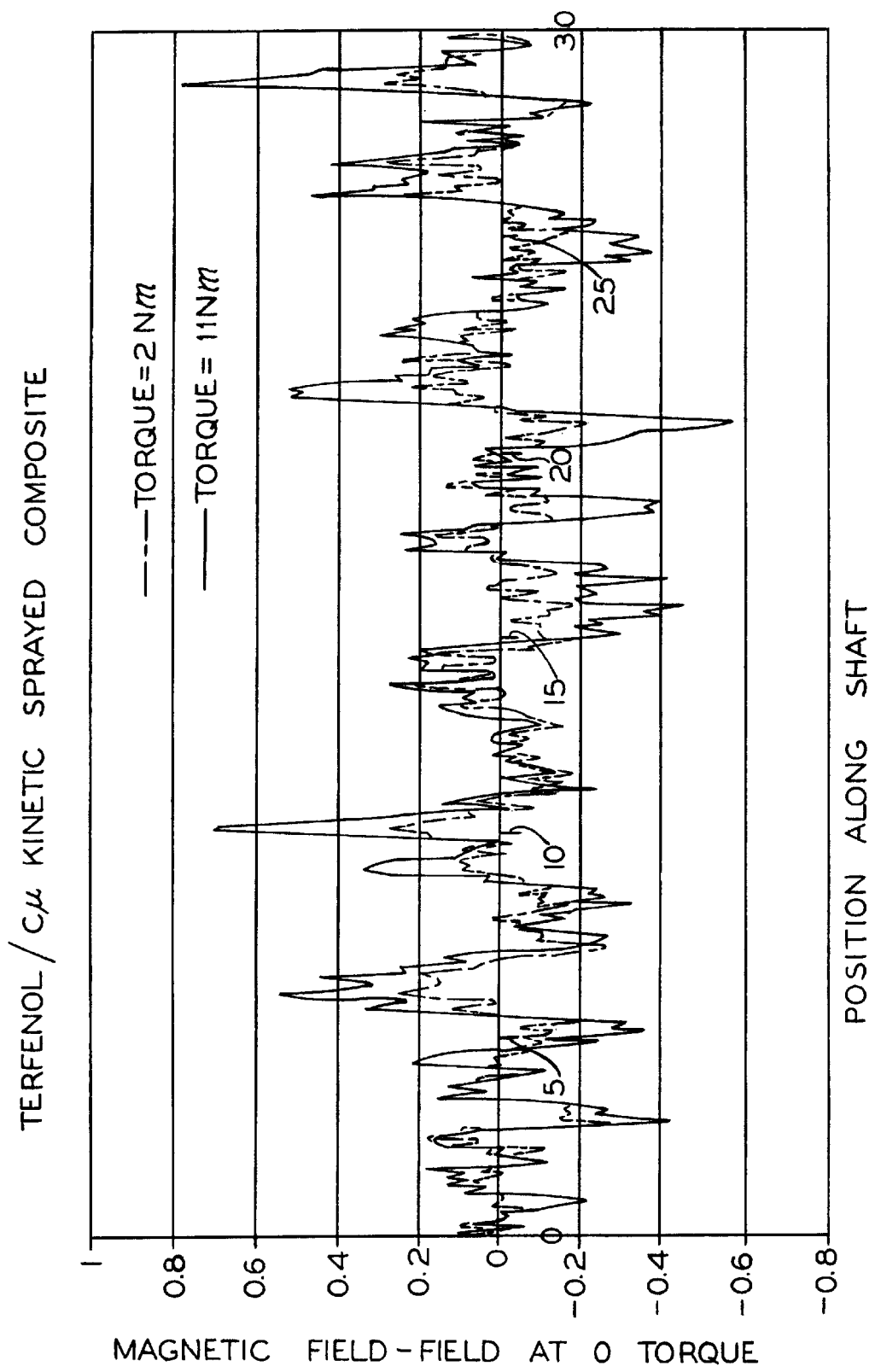
FIG. 9 is a graph of magnetic field response for the coating of FIG. 8 as a difference in field values at torque values of 2 Nm (newton meters) and 11 Nm as compared to field values at zero torque.

Similar measurements were performed for a Terfenol/Cu coating on a Nitronic shaft. FIG. 8 again shows the background field at zero applied torque. FIG. 9 displays the difference field data in a manner distinct from than FIG. 7. Here are shown the changes in magnetic field generated by applied torque values of 2 and 11 Nm.

A summary of torque sensitivities is given in following table.

| RFe2 | Matrix | Shaft material | Passes | Gas temp (F.) | Gun speed (in/s) | Gun nozzle orientation | Shaft speed (RPM) | Torque response (G/Nm) | Torque response (G/10 ppm) |
|---|---|---|---|---|---|---|---|---|---|
| SmFe2 | Cu | Nitronic | 7 | 400 | 0.002 | Parallel | 200 | 0.074 | 0.21 |
| SmFe2 | Cu | Nitronic | 6 | 400 | 0.002 | Parallel | 200 | 0.024 | 0.08 |
| SmFe2 | Cu | Brass | 15 | 400 | 0.125 | Parallel | 350 | 0.027 | 0.02 |
| Terfenol | Al | Nitronic | 2 | 600 | 0.1 | Perpendicular | 300 | 0.049 | 0.13 |
| Terfenol | Al | Nitronic | 2 | 600 | 0.1 | Perpendicular | 300 | 0.069 | 0.19 |
| Terfenol | Al | Nitronic | 2 | 600 | 0.1 | Perpendicular | 300 | 0.053 | 0.12 |
| Terfenol | Ta | Nitronic | 10 | 400 | 0.5 | Perpendicular | 300 | 0.031 | 0.08 |
| Terfenol | Cu | Nitronic | 3 | 800 | 0.1 | Perpendicular | 300 | 0.073 | 0.21 |
| Terfenol | Fe | Nitronic | 3 | 1000 | 0.1 | Perpendicular | 300 | 0.057 | |

Parameters common to all sprays:
RFe2:matrix mix = 50:50
Main gas pressure = 200 psig
Powder feed gas = N2
Powder feed gas pressure = 250 psi Gun nozzle orientation refers to the orientation of the sheet of spray with the axis of the rotating shaft. The plane of the spray "sheet" was either parallel to the axis of the shaft, or perpendicular to it.

The second column from the right shows the torque sensitivity in terms of G/Nm of applied torque. This quantity, however, is sensitive to the geometry of the shaft and coating (in particular, the compliance of the shaft). The rightmost column gives the torque sensitivity in terms of the field generated per 10 ppm of strain induced in the coating; this provides a more geometry-independent measure of sensitivity.

Thus, it has been demonstrated that magnetostrictive composite coatings can be formed on substrates using powder mixtures of rare earth-iron compounds and matrix metals. The powder mixtures are suspended in a supersonic velocity gas and propelled at high velocity against the substrate surface. The high velocity, high kinetic energy powder spray stream is obtained in a preferred embodiment using suitable gas pressure and temperature and directing the stream through a suitable converging-diverging nozzle to accelerate the gas-powder mixture. The impact of the mixed powders on the substrate deforms the matrix metal particles such that they bond to the substrate and capture the magnetostrictive $REFe_2$ particles in an adherent composite coating. The area and thickness of the composite coating is controlled by suitable movement of the nozzle over the surface of the substrate.

The resulting coating retains the magnetostrictive properties of the rare earth-iron compound in the spray mixture. Moreover, with certain matrix metals such as iron and molybdenum the magnetically soft starting material is converted to a composite coating having useful permanent magnet properties.

While the practice of the invention has been described in terms of certain specific embodiments, it will be appreciated that other forms of the invention could readily be adopted by those skilled in the art. Accordingly, the scope of the invention is to be considered limited only by the following claims.

What is claimed is:

1. A method of forming a composite coating of magnetostrictive material on a substrate, said method comprising spraying a powder mixture of magnetostrictive $REFe_2$ particles and matrix metal particles carried in a spray gas stream flowing at supersonic velocity against a substrate to form an adherent coating on said substrate of said $REFe_2$ particles embedded in a matrix of said metal, where RE is one or more rare earth elements including yttrium, and the magnetostrictive character of said $ReFE_2$ particles is retained in said coating.

2. A method as recited in claim 1 comprising spraying a powder mixture initially consisting essentially of twenty to eighty percent by volume of said matrix metal particles and the balance said $REFe_2$ particles.

3. A method as recited in claim 1 in which said RE constituent is one or more lanthanides selected from the group consisting of samarium, dysprosium and terbium.

4. A method as recited in claim 1 comprising conveying a said powder mixture in a volume of gas with respect to said $REFe_2$ particles through a converging-diverging nozzle to achieve said supersonic speed.

5. A method as recited in claim 4 comprising conveying said powder mixture from a reservoir in a first volume of unheated gas into a second and larger volume of gas for entry into said nozzle.

6. A method as recited in claim 5 in which said second volume of gas is preheated to a temperature not exceeding the melting temperature of said matrix metal and said magnetostrictive material.

7. A method as recited in claim 6 in which said first volume of gas is at a pressure not exceeding about 350 psig before mixing with said second volume and said second volume is initially at a lower pressure and not exceeding about 300 psig.

8. A method as recited in claim 5 in which said first volume of gas is at a pressure not exceeding about 350 psig before mixing with said second volume and said second volume is initially at a lower pressure and not exceeding about 300 psig.

9. A method as recited in claim 1 in which said $REFe_2$ particles are in a non-permanent magnetic condition in the powder mixture being sprayed and are converted to a permanent magnetic condition with a coercivity of at least 1000 Oersteds upon impact with said substrate and embedding in the matrix metal of said composite coating.

10. A method as recited in any of claims one through nine in which said substrate is a round shaft.

* * * * *